United States Patent [19]
Kelly

[11] Patent Number: 5,886,515
[45] Date of Patent: Mar. 23, 1999

[54] POWER SEMICONDUCTOR DEVICES WITH A TEMPERATURE SENSOR CIRCUIT

[75] Inventor: Brendan P. Kelly, Stockport, England

[73] Assignee: U.S. Philips Corporation, New York, N.Y.

[21] Appl. No.: 25,369

[22] Filed: Feb. 18, 1998

[30] Foreign Application Priority Data

Feb. 19, 1997 [GB] United Kingdom .................... 9703453
Aug. 13, 1997 [GB] United Kingdom .................... 9717051

[51] Int. Cl.⁶ ................................ G05F 3/16; G06G 7/10
[52] U.S. Cl. .......................... 323/313; 323/907; 327/513; 327/541
[58] Field of Search ..................................... 323/312, 313, 323/314, 315, 316, 907; 327/539, 540, 541, 513

[56] References Cited

U.S. PATENT DOCUMENTS 4,929,884  5/1990  Bird et al. ................................ 323/313
5,563,760  10/1996  Lowis et al. ............................. 361/103

*Primary Examiner*—Peter S. Wong
*Assistant Examiner*—Y. J. Han
*Attorney, Agent, or Firm*—Steven R. Biren

[57] ABSTRACT

A temperature sensor circuit of a power semiconductor component comprises temperature-sensitive elements, some (Q1, and R1 to R3) of which are located in the vicinity of an active area of the component where heat is generated by the power semiconductor device (MPWR), whereas others (such as R4, R') are located more remote from the heat-generating active area and so are in a cool location. Hot-location elements (Q1, and R1 to R3) with different temperature coefficients are present in a first comparator circuit for indicating device temperature (Tabs) in the vicinity of the heat-generating active area. Both hot-location and cool-location elements (R2 and R4) are present in a second comparator circuit for indicating when a temperature gradient (Tdiff) threshold occurs. A circuit connection (5, 7) between the first and second comparator circuits, preferably at the inputs of their respective comparators (CP1, CP2) couples together the hot-location temperature-sensitive elements (Q1, R1, R2, R3) of the first and second comparator circuits so that the temperature gradient threshold sensed by the second comparator circuit decreases as a function of the device temperature (Tabs).

9 Claims, 4 Drawing Sheets

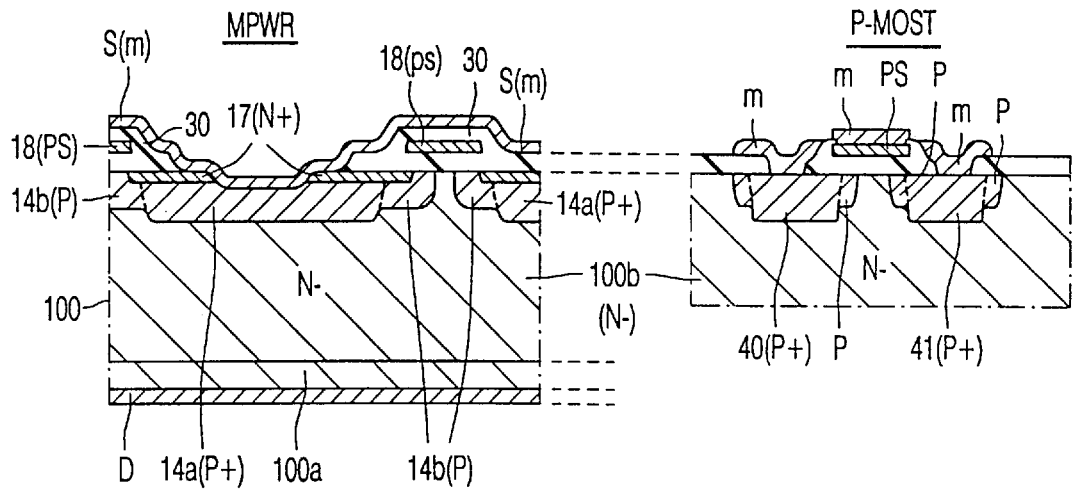
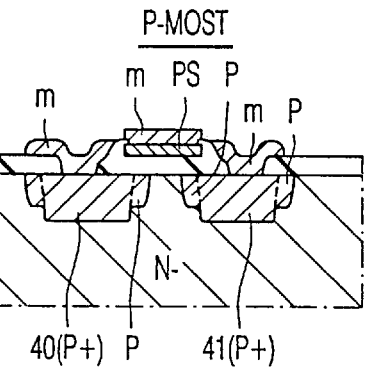
FIG. 4a  FIG. 4b
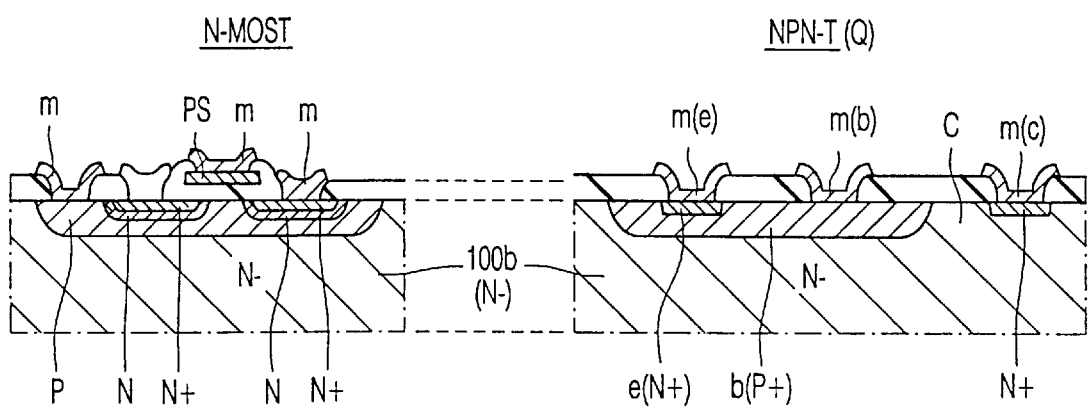
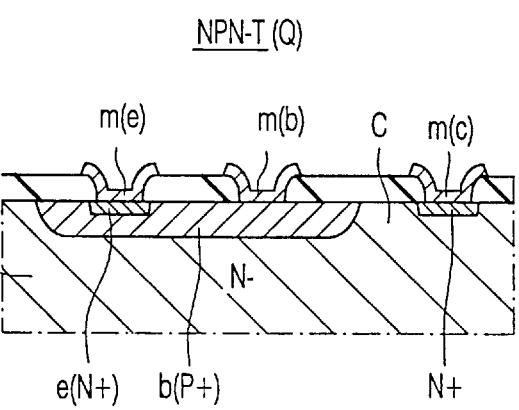
FIG. 4c  FIG. 4d
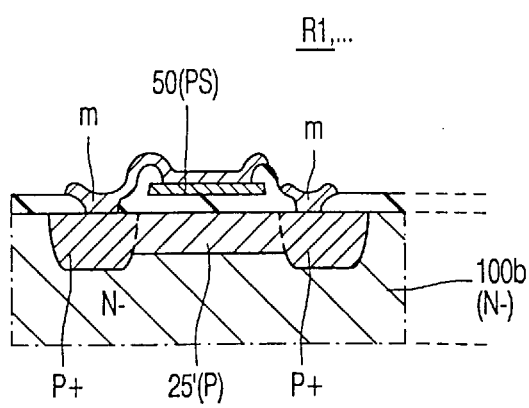
FIG. 4e

POWER SEMICONDUCTOR DEVICES WITH A TEMPERATURE SENSOR CIRCUIT

BACKGROUND OF THE INVENTION

This invention relates to power semiconductor components, for example a switch for automotive switching applications, comprising a power semiconductor device with a temperature sensor circuit. The power semiconductor device may be, for example, an insulated-gate field-effect transistor (hereinafter termed "MOSFET"), an insulated-gate bipolar transistor (hereinafter termed "IGBT"), or a bipolar transistor. The temperature sensor circuit can serve for sensing whether the device is approaching a thermal overload, and it may even be sufficiently sensitive for determining whether the device load is short-circuited.

United States Patent specification U.S. Pat. No. 5,563,760 (our reference PHB 33667) discloses a temperature sensor circuit for such power semiconductor devices comprising hot-location and cool-location temperature-sensitive elements in a comparator circuit. The whole contents of U.S. Pat. No. 5,563,760 are hereby incorporated herein as reference material. In particular, U.S. Pat. No. 5,563,760 discloses a circuit sensing a temperature gradient (Tdiff) threshold between the hot and cool locations. The circuit comprises (e.g. in FIGS. 5 and 6 of U.S. Pat. No. 5,563,760) temperature-sensitive elements serially arranged in first and second parallel arms which form a Wheatstone bridge arrangement in a comparator circuit and which are fed by current sources derived from a PTAT (proportional-to-absolute-temperature) voltage. The biasing of the arms via their respective PTAT current sources is arranged to render the temperature gradient threshold sensed by the Tdiff circuit either independent of the absolute (or actual) device temperature or a decreasing function of the device temperature based on a cool region of the device. The output of the comparator circuit provides a turn-off signal to the power semiconductor device in the event of an excessive Tdiff.

It is an aim of the present invention to provide an even more advantageous temperature sensor for a power semiconductor device, in which a Tdiff threshold sensed by a comparator circuit can decrease as a function of the device temperature at a hot location of the device.

SUMMARY OF THE INVENTION

According to the present invention there is provided a power semiconductor component comprising a power semiconductor device with a temperature sensor circuit, wherein the temperature sensor circuit comprises hot-location temperature-sensitive elements in a first comparator circuit and hot-location and cool-location temperature-sensitive elements in a second comparator circuit, the hot-location temperature-sensitive elements being located in the vicinity of a heat-generating active area of the power semiconductor device, and the cool-location temperature-sensitive element (or elements) being located more remote from the heat-generating active area, the hot-location temperature-sensitive elements of the first comparator circuit have different temperature coefficients for indicating device temperature in the vicinity of the heat-generating active area, the second comparator circuit with both hot-location and cool-location temperature-sensitive elements serves for indicating when a temperature gradient threshold occurs between a hot location in the vicinity of the heat-generating active area and a cool location more remote from the heat-generating active area, and a circuit connection between the first and second comparator circuits which couples together the hot-location temperature-sensitive elements of the first and second comparator circuits and so makes the temperature gradient threshold indicated by the second comparator circuit into a decreasing function of the device temperature at a hot location.

In this context, "hot" and "cool" refer to locations with respective to the heat-generating active area of the power semiconductor device, namely that a "hot" element is in the vicinity of the heat-generating active area while the "cool" element is more remote from the heat-generating active area. So as to facilitate the subsequent discussion, the first comparator circuit which may serve for indicating when a device temperature threshold is reached is herein designated the "Tabs circuit", the device temperature being designated "Tabs". Similarly the second comparator circuit which serves for indicating when a temperature gradient threshold occurs between a hot location in the vicinity of the heat-generating active area and a cool location more remote from the heat-generating active area is herein designated the "Tdiff circuit", the temperature gradient being designated "Tdiff".

The hot-location temperature-sensitive elements of different temperature coefficients in the Tabs circuit may have opposite, i.e. positive and negative, temperature coefficients. Very good Tabs sensitivity can then be achieved using well-established element technologies. Thus, for example, temperature-sensitive elements of positive temperature coefficient (herein designated "PTC") may be in the form of, for example, resistors and/or MOSTs, whereas those of negative temperature coefficient (herein designated "NTC") may be, for example, p-n junction diodes and/or bipolar transistors.

In a temperature sensor circuit in accordance with the invention, the hot-location temperature-sensitive elements of the Tdiff circuit may include hot-location temperature-sensitive elements of the Tabs circuit so as to make the temperature gradient threshold sensed at a comparator input of the Tdiff circuit a decreasing function of the device temperature at a hot location. By thus sharing hot-location temperature-sensitive elements, the total number of hot-location temperature-sensitive elements required can be kept low. Thus, the circuit connection which couples together the hot-location temperature-sensitive elements of the Tabs and Tdiff circuits may be at comparator inputs of Tabs and Tdiff circuits. The temperature-sensitive elements of both the Tabs and Tdiff circuits may be serially arranged in first and second parallel arms. Each arm can provide comparator inputs of both the Tabs and Tdiff circuits.

These first and second arms may form bridge arrangements of the Tdiff and Tabs comparator circuits and may be fed by current sources controlled by a PTAT (proportional-to-absolute-temperature) voltage. The PTAT voltage can be derived, in known manner, across a matched resistance of the same temperature coefficient. The resulting temperature sensor circuit is both sensitive and reliable.

The first arm may comprise a first hot-location temperature-sensitive element of the Tabs circuit biased via a first hot-location temperature-sensitive element of the Tdiff circuit, and the second arm may comprise a second hot-location temperature-sensitive element of the Tabs circuit biased via a cool-location temperature-sensitive element of the Tdiff circuit. In this case, the comparator inputs of the Tabs circuit may be taken from the series nodes of these elements in their respective arms, and the comparator inputs of the Tdiff circuit may be taken from nodes of these arms with their respective PTAT current sources.

In a modified form, the second hot-location temperature-sensitive element of the Tabs circuit may be biased via a second hot-location temperature-sensitive element of the Tdiff circuit in series with the cool-location temperature-sensitive element of the Tabs circuit, and one of the comparator inputs of the Tabs circuit may be taken from a node of this second hot-location temperature-sensitive element of the Tabs circuit with this second hot-location temperature-sensitive element of the Tdiff circuit.

A hysteresis feedback may be provided in the comparators of both the Tabs and Tdiff circuits, or in at least one of them (e.g. the comparator of the Tabs circuit), so as to inhibit hunting or cycling of the temperature sensor circuit. Such hysteresis feedback may be provided in combination with any one or more of the other features of the present invention.

The comparator output of the Tdiff circuit in an arrangement in accordance with the invention can be sufficiently sensitive to be used as a monitor for detecting an excessive temperature rise in the device due to its load becoming short-circuited, e.g. when most of a supply-to-ground voltage is directly across the power semiconductor device as a result of, for example, a lamp or bulb operated by the device having blown into a short-circuited condition. However, the power device may have a specially designed short-circuit detector circuit.

The circuit features in accordance with the present invention, as well as additional circuit functions (if so desired) and their device features may be integrated with the power device using known integration and circuit techniques as described in, for example, U.S. Pat. No. 4,929,884 and U.S. Pat. No. 5,563,760 and/or with novel integrated device structures and techniques as disclosed herein. Thus, United States patent specification U.S. Pat. No. 4,929,884 (our reference PHB 33363) discloses various monitor and/or protective circuits which are advantageous for such power semiconductor devices. The whole contents of U.S. Pat. No. 4,929,884 are hereby incorporated herein as reference material.

BRIEF DESCRIPTION OF THE DRAWING

These and other features in accordance with the present invention are illustrated specifically in embodiments of the invention now to be described, by way of example, with reference to the accompanying diagrammatic drawings, in which:

FIG. 2b is a cross-sectional view of the power semiconductor component on the line II—II of FIG. 2a;

FIGS. 4a to 4e are cross-sectional views of different parts of the semiconductor body of the power semiconductor component of FIG. 1, illustrating how the circuit components of FIG. 1 may be integrated with a power MOSFET or IGBT device using known DMOS technology.

Figure 1:
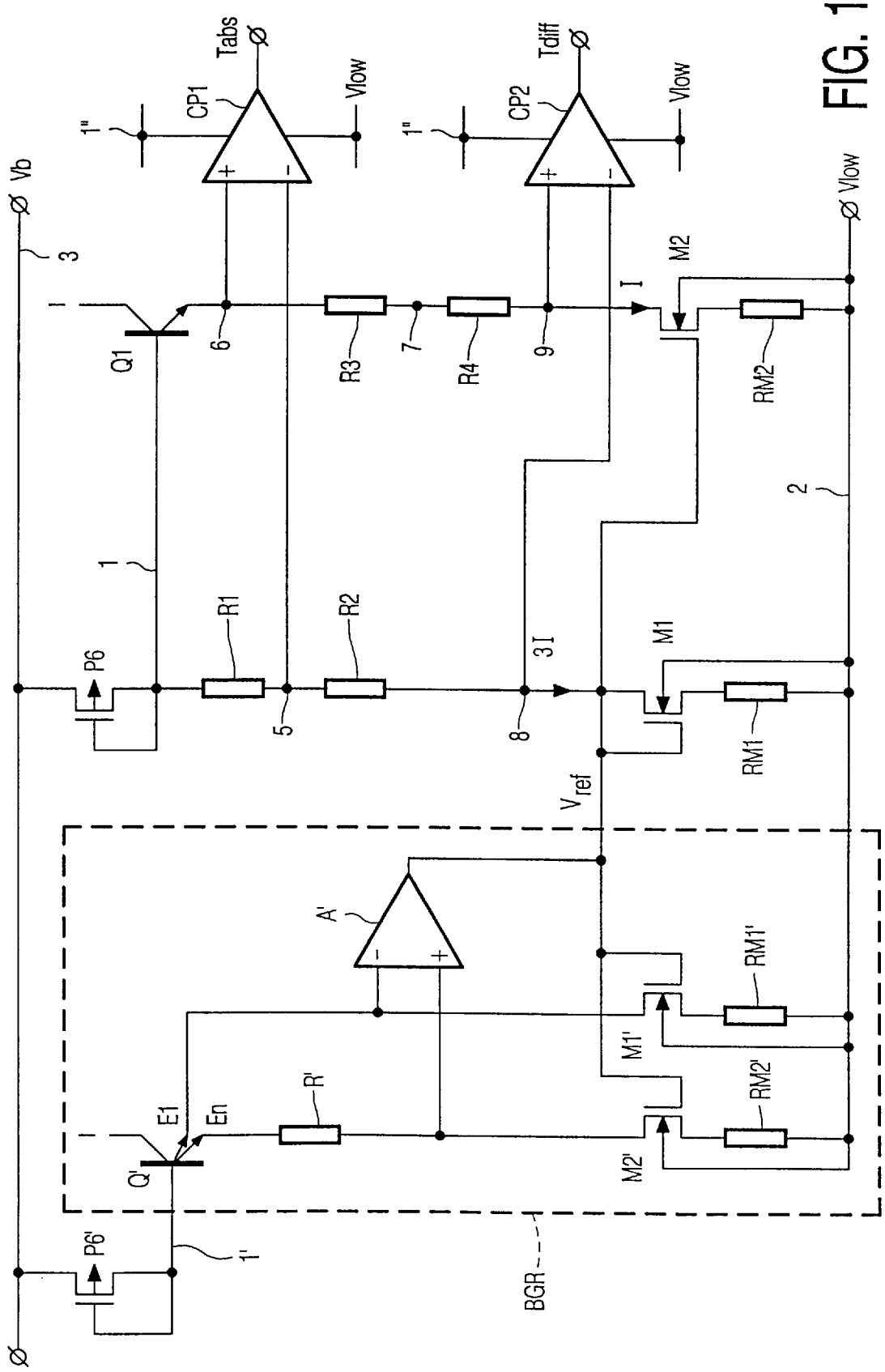
FIG. 1 is a circuit diagram of one embodiment of a temperature sensor circuit of a power semiconductor component in accordance with the present invention.

It should be noted that the drawings are diagrammatic and not drawn to scale. Relative dimensions and proportions of the device parts of FIGS. 2 and 4 have been shown exaggerated or reduced in size, for the sake of clarity and convenience in the drawings.

DESCRIPTION OF THE PREFERRED EMBODIMENTS

FIG. 1 illustrates one embodiment of a temperature sensor circuit of a power semiconductor component, for example a high side switch HSS for automotive switching applications. The circuit of FIG. 1 monitors the thermal condition of the component to sense whether its power semiconductor device (MPWR in FIGS. 2a, 2b and 4a) is approaching a thermal overload, and it provides both Tabs and Tdiff output signals which can be used in known manner to protect the device MPWR against thermal overload by controlling the device operation.

The temperature sensor circuit of FIG. 1 comprises hot-location temperature-sensitive elements Q1 and R1 to R3 in a first (Tabs) comparator circuit and both hot-location and cool-location temperature-sensitive elements R2 and R4 in a second (Tdiff) comparator circuit. The hot-location elements Q1, R1, R2 and R3 are located in the vicinity of an active area of the component where heat is generated by the power semiconductor device MPWR. The cool-location element or elements such as R4 are located more remote from the heat-generating active area. The elements Q1 and R1 to R2 of the first comparator circuit have different temperature coefficients for indicating when a device temperature (Tabs) threshold is reached. The second comparator circuit with both hot-location and cool-location temperature-sensitive elements R2 and R4 serves for indicating when a temperature gradient (Tdiff) threshold occurs between the hot location in the vicinity of the heat-generating active area and the cool location more remote from the heat-generating active area.

Hereinafter the first comparator circuit is designated the "Tabs circuit", and the second comparator circuit is designated the "Tdiff circuit". The hot-location elements of the Tdiff circuit effectively include Q1, R1, R2, and R3 of the Tabs circuit to make the temperature gradient threshold sensed at the comparator inputs of the Tdiff circuit a decreasing function of the device temperature Tabs at a hot location. The elements R1-R2 and Q1-R3-R4 in the FIG. 1 circuit are arranged in common arms of the Tabs and Tdiff circuits (via nodes 5 to 9), and the nodes of these arms provide a circuit connection between the Tabs and Tdiff circuits which couples together the hot-location temperature-sensitive elements of both the Tdiff and Tdiff circuits and so makes the temperature gradient threshold indicated at the Tdiff circuit output into a decreasing function of the device temperature Tabs at the hot location. Thus, R1 and Q1,R3 provide an imbalance voltage (which is responsive to the absolute temperature Tabs of hot locations of the device) at the voltage-supply ends of R2 and R4. A temperature gradient between R2 and R4 can counter this temperature-sensitive imbalance voltage, and so the Tdiff threshold in the Tdiff circuit derates in real-time with Tabs.

This circuit is a novel way of optimally combining temperature sensitive elements to combine differential and absolute over-temperature detection functions so as to provide safe (near ideal) thermal protection for a power device MPWR while still allowing the device's inherent thermal capacity and transient load driving capability to be fully exploited.

Two main methods of thermal overload detection have been used previously. The first is an absolute temperature (Tabs) detector based on a sensor or multiple sensors which are close to or positioned within the power device area. An example is described in U.S. Pat. No. 4,929,884 (our reference PHB 33363), the whole contents of which are hereby incorporated herein as reference material. The second is a differential temperature (Tdiff) sensor which detects the local temperature rise at the edge of the power device active area compared with some location further from the power device. Examples are described in U.S. Pat. No. 5,563,760.

The first method has the disadvantage that, if the power device is initially cool overall, then extremely large temperature gradients may be developed by overload conditions before the device can be turned off. In the case of repetitive overload conditions then these large temperature gradients can cause significant damage to the semiconductor body (chip) and its associated packaging/mounting hardware.

The second method effectively limits the maximum temperature gradient at a value which can safely be survived even if the device is initially hot overall. Unfortunately, this therefore limits the extent to which the thermal capacity of an initially cool device may be exploited, because of the need to protect warm or hot devices also.

A temperature-sensing circuit in accordance with the present invention combines these two functions Tabs and Tdiff in a circuit configuration, in which the actual temperature sensitive elements (such as Q1, R1 to R4) may also be shared in a common arrangement, for example as in the FIG. 1 circuit. Whereas in U.S. Pat. No. 5,563,760 it was envisaged to derate the Tdiff limit according to a cooler absolute temperature sensor, Tdiff in this new circuit is derated according to absolute temperature (Tabs) sensors Q1,R1 operating in the hot location. The combined Tdiff-Tabs circuit may include a band-gap reference circuit (for example the circuit block BGR of FIG. 1) which can be of a known, fairly standard type. When hysteresis is included in this combined Tdiff-Tabs circuit, the hysteresis feedback is absent from the common sensor arrangement but can be provided within the comparator function.

Figure 2A:
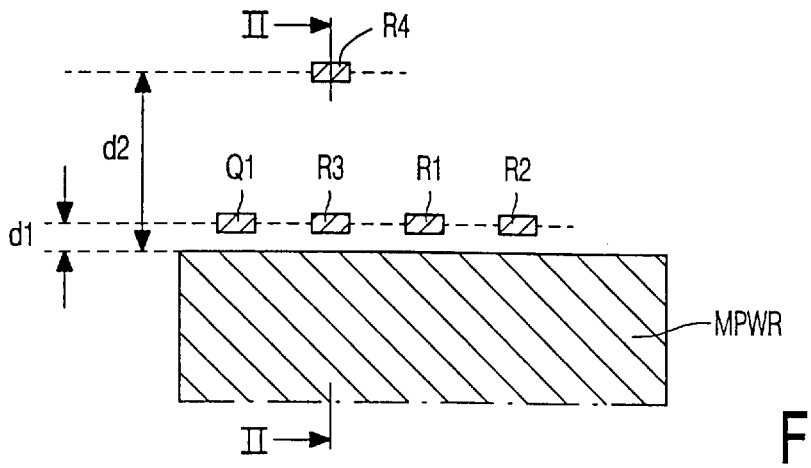
FIG. 2a is a plan view of a power semiconductor component in accordance with the present invention, illustrating one layout embodiment for hot-location and cool-location temperature-sensitive elements in relation to the power semiconductor device of the component.
Figure 2B:
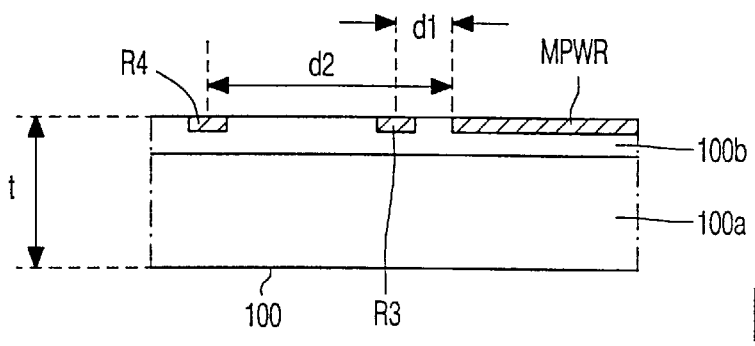

FIG. 1 illustrates a specific embodiment of the novel temperature sensing circuit, which has a Wheatstone bridge network comprising the temperature-sensitive resistances Q1 and R1 to R3 in hot locations (i.e near the power device MPWR) and the temperature-sensitive resistance R4 is in a cooler location (i.e more distant from the power device MPWR), see example in FIGS. 2a and 2b. In this specific example, Q1 is a NTC band-gap sensor, whereas R1 to R4 are PTC resistances. The first arm of the bridge comprises hot-location R1 of the Tabs circuit biased via hot-location R2 of the Tdiff circuit, and the second arm comprises hot-location Q1 of the Tabs circuit biased via hot-location R3 in series with cool-location R4 of the Tdiff circuit. The Tabs circuit comprises a comparator CP1 having inputs taken respectively from the series node 5 of R1-R2 and from the series node 6 of Q1-R3. The Tdiff circuit comprises a comparator CP2 having inputs taken from the nodes 8 and 9 of R2 and R4 with their respective PTAT current sources M1 and M2.

The base of Q1 and one end of R1 are coupled to a first supply line 1 derived from a power line 3 at a voltage Vb. The opposite ends of these two arms of the bridge are fed by their respective PTAT current sources M1 and M2, through series resistors RM1,RM" which are connected to a second supply line 2. The circuit of FIG. 1 may be formed of low voltage semiconductor circuit components which are integrated monolithically with the high voltage power device MPWR using the circuit integration principles disclosed in U.S. Pat. No. 4,929,884. Thus, the device substrate may be connected to a high voltage (Vb) terminal of the power supply (for example a battery), and the low voltage semiconductor circuit components of the FIG. 1 circuit can operate from a low voltage supply Vlow which is regulated with reference to the high voltage terminal. Thus, the line 2 of FIG. 1 is an artificial ground at Vlow, with line 1 at a more positive potential. In this case, the current sources M1 and M2 are actually sinks, drawing current through their respective first and second arms R1, R2 and Q1,R3, R4 of the bridge. The line 1 may be directly connected to the power line 3 and so be at the positive supply voltage Vb. However, it may be beneficial to set the line 1 at a lower voltage than Vb so as to centre the bridge output voltages (at nodes 5,6,8,9) close to the ideal input range of each comparator CP1 and CP2. Thus, by way of example, FIG. 1 illustrates reducing the voltage level of line 1 by a diode-connected MOST P6 coupled between the lines 3 and 1.

Current flow through the NMOSTs M1 and M2 forming these current sinks is controlled by a PTAT voltage Vref applied to their gates from a reference circuit, namely block BGR of FIG. 1. The reference circuit BGR, operating at the same ambient temperature as the cooler areas of the chip, controls a precision voltage which is directly proportional to absolute temperature (PTAT) and which is derived from across a resistor R' using a current sink, in a similar manner to the PTAT voltage source described in U.S. Pat. No. 5,563,760. Thus, the reference circuit BGR comprises a bipolar transistor Q' having two emitters E1 and En, the effective emitter area of En being J times larger than that of E1, (for example, En may be composed of a plurality J of emitters each having the geometry and area of E1). For bipolar transistors with a low gain, there are several orders of magnitude (e.g. 6 decades) of emitter current le for which the base-emitter voltage Vbe is a logarithmic function of le, the slope of which is directly proportional to temperature. Thus, by operating two similar-technology emitters El and En at different emitter current densities but with a fixed ratio, the difference dVbe in their Vbe values is a constant directly proportional to absolute temperature. The emitter-base junctions of Q' act as NTC bandgap temperature sensors and respond in the same way to a temperature change as do the emitter-base junction of Q1, because both Q' and Q1 were fabricated in the same bipolar transistor process technology.

Emitter E1 of Q' is connected directly to a NMOST M1' acting as a current sink via a series resistor RM1' to the Vlow line 2. Emitter En is coupled via a series resistor R' to a NMOST M2' acting as a current sink with a series resistor RM2'. The voltage difference dVbe (the PTAT voltage) which occurs between E1 and En is impressed across the resistor R', in the following manner. The resistor R' is fabricated in the same process technology as the resistors R1 to R4, RM1, RM2, RM1', RM2' so as to respond in the same way to a temperature change.

A differential amplifier A' takes inputs directly from the respective serial nodes of R'-M2' and E1-M1' and provides an output in the form of a voltage Vref. The output of A' is connected to the gates of M1, M2, M1' and M2' to control the magnitude of current through M1, M2, M1' and M2' by means of Vref. The feedback from M1' and M2' to the inputs (−) and (+) of A' ensures that the voltages at their nodes with R' and Q' E1 are equal. This means that the voltage difference dVbe (the PTAT voltage) is impressed across R'. The gate control of M1 and M2 by the output voltage Vref of A' ensures that the currents fed to the bridge arms R1,R2 and Q1,R3,R4 are proportional to those through M1' and M2'. Thus the voltage across the cool-location R4 is proportional to the voltage difference dVbe (the PTAT voltage) which is impressed across the cool-location R'. Furthermore, when the hot-location R1, R2, R3 are not hot (i.e. also at the same cool temperature as R' and R4), then the voltages across R1, R2, R3 are also proportional to the voltage difference dVbe (the PTAT voltage) which is impressed across R'.

Other PTAT voltages scaled to any absolute magnitude can be generated by using the Vref output of A' to control another matched or ratioed current sink or source (in a similar manner to M1 and M2) drawing current through a matched or ratioed resistor (in a similar manner to RM1, RM2, and R1 to R4, as compared with R'). Thus, the control voltage Vref for current sink elements is distributed also to other circuits of the power semiconductor component, so that any circuit containing similar matched or ratioed current sink elements and a matched or ratioed resistor of this particular type can be used to generate further PTAT voltages of different magnitudes. The circuit block BGR illustrates one specific example of PTAT reference circuit, and it will be evident that other known forms of PTAT reference circuit may alternatively be used with a combined Tabs and Tdiff circuit in accordance with the invention.

Both the line 1 of Q1,R1 and base line 1' of Q' can be individually set to appropriate potentials to match the respective input working ranges of A', CP1 and CP2. Thus, the base of Q' may be connected directly to the power line 3, or it may be coupled indirectly (for example, by a diode-connected MOST P6') to provide more suitable voltage input levels for amplifier A'. Preferably, M1', M2', M1, and M2 are coupled to the line 2 by source degeneration resistors RM1', RM2', RM1, and RM2 of suitable magnitude to operate these MOST current sinks with an approximately zero temperature coefficient, so that the actual location of these Mx,RMx networks in cool areas (remote from MPWR) is not critical. The geometries of M1', M2', M1, and M2 are ratio-matched, as are RM1', RM2', RM1, and RM2.

Particular operational features of this FIG. 1 circuit in accordance with the invention are:

Tabs part

In the new temperature sensor circuit, R1 is biased using the above technique to have a PTAT voltage across it; Q1, which is of the same bipolar transistor type as the band-gap ratioed emitters of bipolar device Q' in the reference circuit BGR, has a base-emitter voltage Vbe which reduces with absolute temperature. The magnitude of R1 and the geometries of M1,RM1 and Q1,M2,RM2 are chosen such that the PTAT voltage across R1 and the base-emitter voltage of Q1 become equal at the desired absolute trip temperature (Tabs, e.g. 165° C.).

The Tabs comparator CP1 comparing these voltages at its inputs (-) and (+) provides an output signal Tabs indicating that an absolute over-temperature condition has occurred. This output signal Tabs enables the power device MPWR to be turned off and a status signal issued. Once this transition occurs, the Tabs comparator CP1 may force an input offset to provide hysteresis of a few tens of millivolts so as to maintain its status signal and inhibit temperature cycling or hunting. The over-temperature status signal will remain active until the sensors R1 and Q1 cool slightly, e.g. by 10° C., at which point the control logic may turn the power device MPWR on again.

Tabs derating for Tdiff

The potentials at the lower end of R1 and Q1 (i.e their respective nodes 5 and 6 with R2 and R3) are arranged to be equal at the desired absolute trip temperature Tabs.

The potentials at the lower end of R1 and R3 (i.e their respective nodes 5 and 7 with R2 and R4) do not become equal until some higher temperature, e.g. 200° C. The imbalance at these nodes 5 and 7 is used as the built-in offset of the Tdiff bridge formed by R2 and R4. The temperature where this imbalance derates to zero is well defined with respect to the normal Tabs trip point, being based on the values of resistance and PTC temperature coefficient of the precision absolute temperature sensors R1 and Q1 and the further matched resistor R3. Thus, R3 adds a small PTAT voltage to the Vbe voltage of Q1 (which is the same effect as subtracting some PTAT voltage from the drop across R1) so that a little of the NTC of Q1 is compensated by the PTAT voltage across PTC R3. Voltage balance of node 7 at the bottom of R3 with node 8 at the bottom of R2 is therefore reached at a higher temperature than the balance of nodes 6 and 5. Tdiff part When the current sinks M1,RM1 and M2,RM2 are equal, then the Tdiff operation can be understood in terms of a matched R2 and R4. However, when the current sinks M1,RM1 and M2,RM2 are ratioed (e.g. with the channel width of M1 being three times that of M2 and the resistor width of RM1 being three times that of RM2) then the geometry (and hence resistance values) of R2 and R4 are also ratioed according to their respective current sink elements M1,RM1 and M2,RM2, so as to arrange that R2 and R4 have the same voltage across them when there is no differential temperature gradient Tdiff between them. At any given absolute (hot location) temperature, the imbalance voltage at the tops of R2 and R4 (nodes 5 and 7) divided by the average voltage across R2 and R4 and divided by the temperature coefficient of the resistors R2 and R4 determines the differential temperature difference, Tdiff, which will bring the lower nodes 8 and 9 of R2 and R4 back to equal potentials. The comparator CP2 compares these two voltages at nodes 8 and 9 and signals if this condition is exceeded. Again hysteresis may be applied allowing the power device MPWR to automatically re-start when the temperature gradient Tdiff falls, or the output may be used to latch the device MPWR off until an external reset signal is received.

Figure 3:
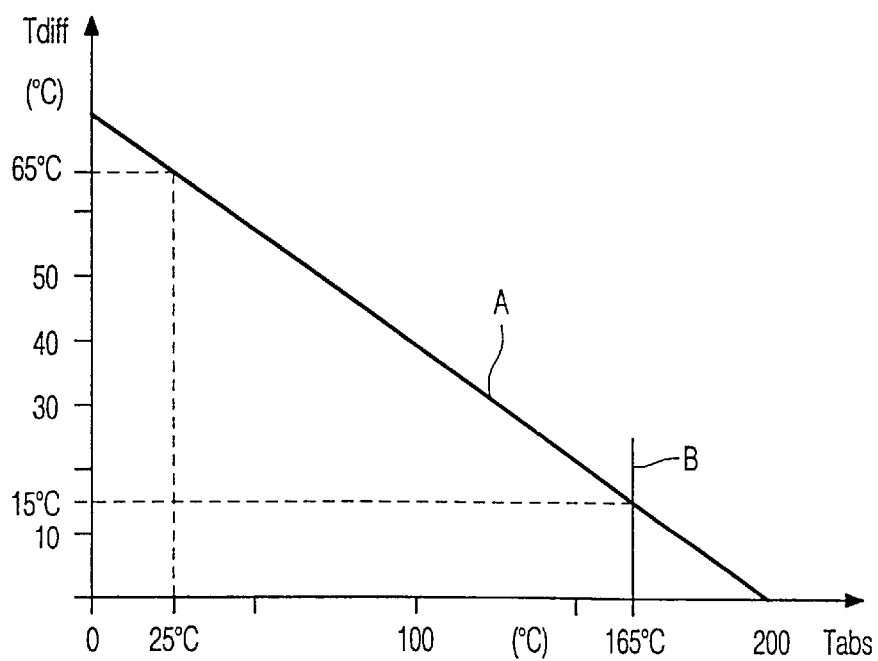
FIG. 3 is an illustrative plot of Tdiff in °C versus Tabs in °C, showing typical examples in respective lines A and B of the temperature thresholds at which the Tdiff and Tabs comparators CP1 and CP2 will trip in the FIG. 1 circuit for the power semiconductor component of FIG. 1.

The Tdiff value at which CP2 will trip is a direct function of the actual absolute temperature Tabs at the hot sensors, for example as illustrated in FIG. 3. The horizontal Tabs axis corresponds to the actual device temperature at the hot locations of (and sensed by) Q1, R1, R2 and R3. The vertical Tdiff axis corresponds to the actual difference in temperature between (and sensed by) the hot-location R2 (and Q1, R1 and R3) and the cool-location R4. The line B illustrates the temperature along the horizontal axis at which the Tabs comparator CP1 trips, as described above. This Tabs trip temperature (165° C. in this example) is independent of Tdiff. The line A illustrates the variation in the differential temperature at which the Tdiff comparator CP2 trips, which is a function of Tabs. Thus, as can be seen from FIG. 3, CP2 trips at a higher Tdiff (e.g. 65° C.) when Tabs is low (e.g. at room temperature, 25° C.) but at a lower Tdiff (e.g. 15° C.) when Tabs at the hot location is high (e.g. at 165° C.). Thus, the allowable Tdiff depends on the temperature at the hot location and is constantly adjusted according to the absolute hot sensors Q1,R1,R2,R3.

In many cases, a large inrush of current into a power device MPWR is needed in order to switch a load (such as a lamp or a motor when stationary) which is difficult to start. The temperature sensor circuit of FIGS. 1 to 3 is able to cope well with such an inrush, while also protecting the device. As can be seen from FIG. 3, an initially overall cool (e.g. 25°

C.) device MPWR can operate with a large current inrush generating a large differential temperature (of e.g. 65° C.) before tripping the Tdiff detector. With appropriate positioning of the hot and cool sensors Q1, R1 to R4, this trip level can equate to a peak temperature, deep within the active area of the power device, of about 200° C., but the Tabs circuit will trip if the Tabs average temperature at the periphery of the active device area exceeds, e.g. 165° C., so that there is no damage or malfunction of the power device MPWR and logic circuitry. Thus, a large inrush can be handled from a start condition (low Tabs). The large inrush producing this trip level is smaller than that which would trip a prior art circuit sensing Tabs alone, because in such a prior art circuit the peak temperature in the power device area might be well over 200° C. before peripheral or embedded "hot" sensors reach a 165° C. trip point. Thus, with the Tabs-only approach of the prior art so much thermal energy may be stored in the power device MPWR that logic circuits in control areas of the device may suffer malfunction or damage due to heat later spreading to these circuits from the power device area, even if the power device itself is not harmed.

At higher temperatures closer to the Tabs trip point the circuit trips at lower Tdiff values to ensure again that excessive peak temperatures cannot occur in the power device area. The thickness t (see FIG. 2) of the device chip affects the extent to which heat flows laterally from the power device area to surrounding circuitry before being efficiently sunk by vertical heat flow across thickness t to the chip support. Typically the cool location for R4 is at a distance d2 (away from the active power device area) which is comparable to the thickness t. The hot locations for Q1, RI, R2, R3 is at a much closer distance dl, for example between t/5 and t/4. With suitable lateral positioning of the hot and cool sensors according to the thickness t of the chip, the arrangement can be such that it effectively imposes an extrapolated safe peak temperature limit within the power device active area of e.g 200° C. Typically the thickness t is about 0.25 mm for a MPWR in the form of a vertical power MOSFET or IGBT. The power MOSFET or IGBT may have a heat-generating, active surface area of, for example, 10 mm$^2$ consisting of, for example, tens of thousands of parallel cells. The hot locations for the sensors Q1, R1, R2, R3 may be a distance d1 of about, for example, 50 $\mu$m from the periphery of the MPWR active surface area. The cool location for R4 may be a distance d2 of about, for example, 200 $\mu$m away. The other circuit components such as M1, M2, RM1, RM2, Q', R', M1', M2', . . . etc. are located no closer to the MPWR active surface than R4.

Thus, the resistance value of the various resistors are chosen as follows, in accordance with the current levels through the different arms. The value of PTC resistor R1 is chosen to give, at the Tabs trip temperature, a voltage drop at node 5 which balances that at node 6 of the NTC Q1. The resistance values of R2 and R4 may be chosen to give the same voltage drop across R2 and R4 when R2 and R4 are at the same temperature (thus R2=R4, if the same current flows through R2 and R4; but R2=a third of R4, when the current through R2 is three times that through R4). The small PTC resistor R3 is of a value sufficient to give a voltage drop providing the built-in offset of the Tdiff bridge. In a specific example of the Q1,R1-R4 bridge the geometries of the current sink MOSTs M1 and M2 and their source resistors RM1 and RM2 may be ratio-matched to give a current (3I) through M1 which may be 3 times that (I) through M2; in this specific example, R1 to R4 may then have the following resistance values at room temperature: R1 9 k$\Omega$, R2 30 k$\Omega$, R3 6 k$\Omega$, and R4 90 k$\Omega$, whereas RM1 may be 15 k$\Omega$, and RM2 may be 45 k$\Omega$. The value of R' may be, for example, 7 k$\Omega$, with an emitter ratio for Q' of, for example, 14 to 1.

In a modification of the FIG. 1 circuit which is also in accordance with the present invention, there is no R3 between R4 and Q1, so that the hot Q1 is fed directly from the cool R4, and the comparator input (+) of the CP1 is taken from a common node 6,7 of Q1 and R4. In this case, the resistance value of R4 is made slightly higher than that of R2, in order to compensate for the absence of the small-value R3. This results in a slight compromise in performance, which can be acceptable in some situations.

Figure 5:
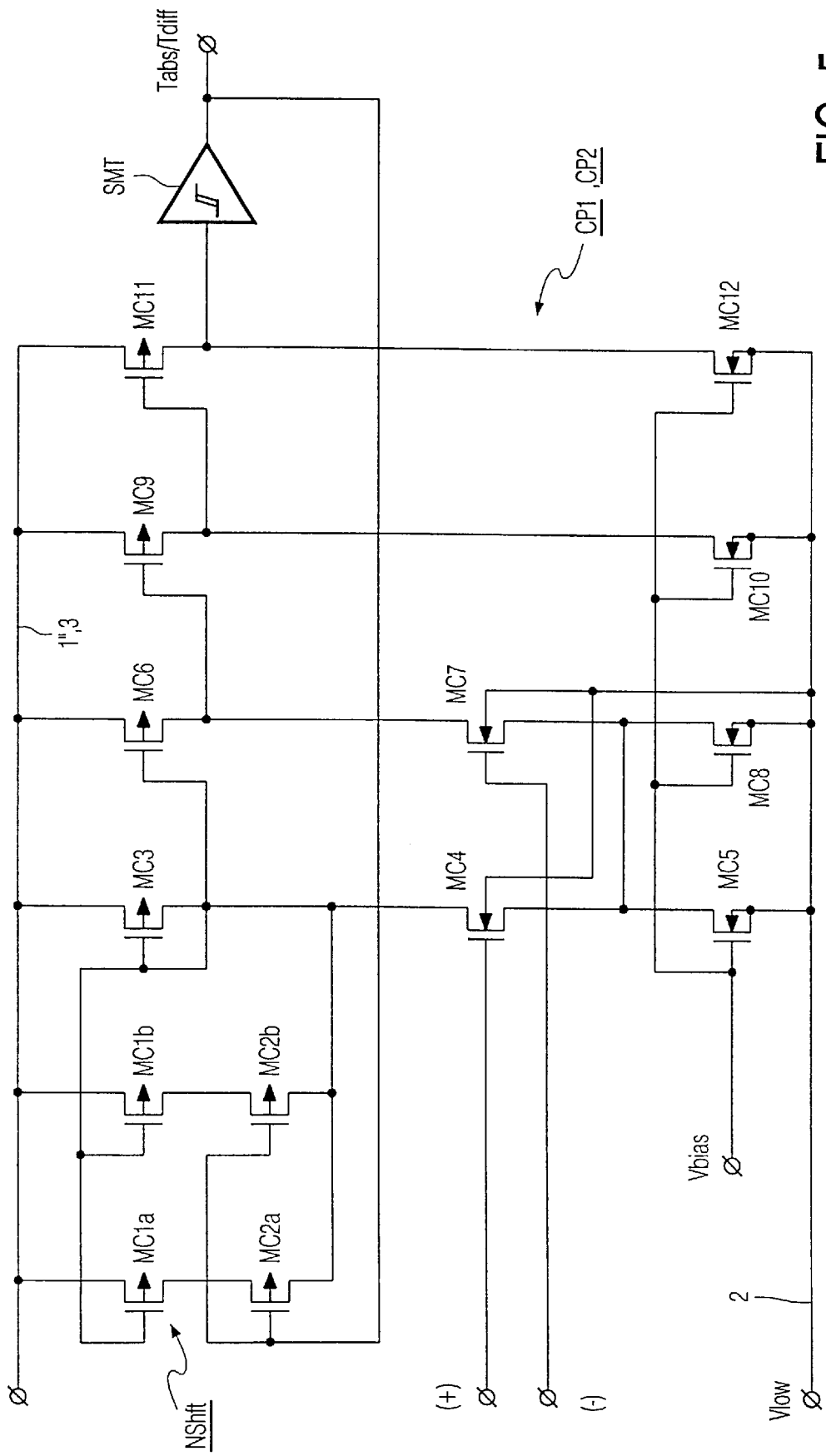
FIG. 5 is a circuit diagram of a comparator with hysteresis, and suitable for use in the circuit of FIG. 1.

FIG. 5 illustrates one example of a comparator circuit suitable for use as the comparator CP1 and/or CP2, i.e for both or either of the Tabs and Tdiff circuits of FIG. 1. The comparator includes a hysteresis feedback from its Tabs or Tdiff output, in order to inhibit hunting or cycling of the temperature sensor circuit of FIG. 1. This hysteresis feedback is achieved in the FIG. 5 circuit (via an optional Schmitt trigger SMT in series with the comparator output) to a shift input stage NShft of the comparator, so as to increase the conductance of MC3. In the FIG. 5 circuit, MC4, MC5, MC7, MC8, MC10 and MC12 are n-channel enhancement MOSTs, whereas MC1a, MC 1b, MC2a, MC2b, MC3, MC6, MC9 and MC11 are p-channel enhancement MOSTs. In the following description the transistors are functionally grouped together using the "+" symbol and are designated using appropriate terminology describing their circuit function. The positive potential on the voltage supply rail 1"/3 may be that of power line 3 or an appropriately lower-potential voltage line 1" (as already described for lines 1 and 1' in FIG. 1).

The operation of the FIG. 5 comparator can be best understood by first neglecting the effect of MC1a/b and MC2a/b (as if MC1a/b and MC2a/b were absent, or as if MC1a/b and MC2a/b were considered to be non-conducting). The parallel pair MC5+MC8 sink a quiescent current for the common-source comparator pair MC4+MC7 which in turn they draw from the mirror pair MC3+MC6. Thus MC5, MC8, MC4, MC7, MC3 and MC6 form a classical differential amplifier core. An inverter comprises MC9 and MC1 0, and a further inverter comprises MC1 1 and MC12. The threshold of MC9 is matched to the thresholds of the mirror pair MC3+MC6 by virtue of the relative geometries of MC9 to MC3+MC6 and of MC10 to MC5+MC8, so that the mirror pair MC3+MC6 and the comparator input pair MC4+MC7 must be exactly in balance with inputs (+) and (−) at equal potentials in order to bias the inverter in its active switching region. Similarly the threshold of MC11 is matched to the preceding threshold of MC9. The inverter MC9+MC10 is a classical method of obtaining a single ended output from the classical differential amplifier core. The inverter MC11+MC12 adds sufficient gain that the threshold mismatch of the following buffer (Schmitt trigger SMT) compared to the MC3 and MC6 thresholds, causes very little offset error at the input. For example the differential amplifier core MC3 to MC8 may have a differential gain of, for example, 100, and the first and second inverters may each have a gain of, for example, 10. So the input hysteresis and threshold mismatch voltages of SMT, compared to the preceding inverters, cause an input offset voltage which is just one ten thousandth in magnitude, and a mismatch of, for example, 1 V would at the (+) and (−) inputs be equivalent to a 100 gV offset.

Thus, neglecting MC1a /b and MC2a/b the circuit function is simply a precision low offset comparator with a very small input hysteresis.

In the case where the (+) input is at a significantly higher potential than the (−) input, then the output (Tabs/Tdiff) will be at the positive rail and the PMOSTs MC2a and MC2b will therefore be off. In this condition PMOSTs MC1a and MC1b can have no effect on the mirror MC3+MC6. If the two inputs (−) and (+) are driven closer together then the overall circuit state remains much the same until the inputs become so close that the inverters MC9+MC10 and MC11+MC12 enter their active switching regions. The input offset of the overall comparator is very small in this state.

However, once the inputs are considered to have passed each other, such that the (+) input is at a higher potential than the (−) input, then the SMT input and output will swing to the negative Vlow rail 2 and the PMOSTs MC2a and MC2/b will be rendered conducting. It is now that the effect of MC1a/b and MC2a/b must be considered. The gates and sources of MC1a and MC1b are connected directly to the gates and sources of mirror pair MC3+MC6. When MC2a and MC2b are in the ON state, then the drains of MC1a and MC1b are also connected effectively in parallel with the drain of MC3 in the mirror pair MC3+MC6. Thus the mirror ratio of mirror MC3 and MC6 is no longer 1:1 but may be, for example, 2:1 with ⅔ of the comparator core quiescent current flowing in the MC3 side and ⅓ flowing in the MC6 side. These now unbalanced currents determine the respective thresholds of the input MOSTs MC4+MC7 of the differential amplifier core such that the threshold of MC7 is now lower than the threshold of MC4 by an amount depending on the ratio of currents and their gain, for example by 30 mV. Thus, once the inputs have passed each other, a large input offset is assumed by the comparator, so as to give effect to a hysteresis loop of FIG. 5, with MC2a/b on in one state and off in the other state. An advantage in feedback coupling via the Schmitt trigger SMT, rather than a direct coupling, is to ensure that when approaching the balanced condition there can be no gradual turn on of MC2a/b (which might create a slight offset); instead MC2a/b are held completely off until the Schmitt trigger SMT changes its output state.

FIGS. 4a to 4e illustrate (by way of cross-sectional views of different parts of a semiconductor body 100) how the circuit components which may be used in the circuits of FIGS. 1 and 5 may be integrated with a power MOSFET or IGBT device (MPWR) using known DMOS technology in a manner similar to that in U.S. Pat. No. 4,929,884.

A specific example is illustrated using conventional DMOS technology to form a power MOSFET or IGBT device of the n-channel enhancement-mode type. In this case, the semiconductor body 100 comprises a relatively lowly-doped n-type silicon epitaxial layer 100b (N−), which forms the drain drift region of the MOSFET or IGBT device, and which is provided on a single-crystal silicon substrate 100a of relatively highly-doped n-type (for the MOSFET) or p-type (for the IGBT). One source cell of the device MPWR is shown in FIG. 4a.

The source cell is of known type comprises, adjacent one major surface of the semiconductor body region 100b, a p-type transistor-body region 14 which contains a highly-doped n-type (N+) source region 17. In a low-doped (P) part 14b of the region 14 between the regions 17 and 100b there is a conduction channel area under the insulated gate 18 of the power MOSFET or IGBT device. This gate 18 may be a doped polycrystalline silicon layer, designated PS. As shown, the p body region 14 of the cell also has a central highly-doped (P+) subsidiary region 14a which is shorted to the source/cathode electrode S of the power device to inhibit parasitic bipolar action. The source/cathode electrode S and gate electrode G (not shown) are formed by metallisation m provided on top of an insulating layer 30 and making contact to the N+ source region 17 and insulated gate 18, respectively, via appropriate contact holes. The drain/anode electrode D is provided on the other major surface of the semiconductor body 100.

FIG. 4b shows an example of a possible structure for an enhancement mode p-channel MOST, for example P6 and P6' of FIG. 1, and MC1 to MC3, MC6 MC9 and MC11 of FIG. 5, such as may be fabricated using this DMOS technology. The MOST has p conductivity type source and drain regions 40 and 41 (P with P+ contact regions) which are formed by doping an area of the N−region 100b in both the low-doped (P) and highly-doped (P+) p-type doping stages for the power transistor-body parts 14a and 14b. Its gate of polysilicon PS is formed in the same process steps as the gate 18 of the power transistor. Parts of the metallisation pattern m form its source, gate and drain connectors.

FIG. 4c shows an example of a possible structure for an enhancement mode n-channel MOST, for example the MOSTs MC5, MC8, etc of FIG. 5, such as may be fabricated using this DMOS technology. The MOST is formed in a p-type well P formed in an area of the N−region 100b in the low-doped p-type doping stage for the power transistor-body part 14b. In this p-type well P, n-type source and drain regions (N with N+contact regions) are formed by doping in an extra low-doped (N) n-type doping stage and the highly-doped (N+) n-type doping stage for the power transistor source region 17. Its gate of polysilicon PS is formed in the same process steps as the gate 18 of the power transistor.

FIG. 4d shows an example of a possible structure for an n-p-n bipolar transistor, for example Q1, Q' of FIG. 1, such as may be fabricated using this DMOS technology. An area of the N−region 100b forms the collector region of the transistor, together with a N+ contact region. A base region b is formed in this area of the N−region 100b in the high-doped P+ p-type doping stage for the power transistor-body part 14a. In this P+ p-type base region b, an n-type emitter region e is formed by doping in the highly-doped N+ n-type doping stage for the power transistor source region 17.

FIG. 4e shows an example of a possible structure for the PTC resistors R1, R2, etc. of the FIG. 1 circuit, such as may be fabricated using this DMOS technology. In this particular example the resistor has a resistance region 25' (P) which is formed by doping an area of the N−region 100b in the low-doped p-type doping stage for the power transistor-body part 14b; and contact regions P+ are formed in the same process steps as the highly-doped power transistor-body part 14a and are contacted by metal connections m. The resistor may include a top plate 50 formed by doped polysilicon (PS) on a dielectric film on the resistance region 25' in the same process steps as the power transistor gate 18 on the gate dielectric of the power transistor MPWR. The plate 50 acts as an electrostatic screen which is connected to the most negative contact of the resistor by its metal connection m. However, the resistance region 25' may be formed by doping an area of the N−region 100b in the high-doped p-type (P+) doping stage for the power transistor-body part 14a. Alternatively, instead of using the p-type doping, resistance regions may be formed with n-type conductivity by using, for example, the N+ doping stage used to provide the source regions 17. These n-type resistance regions can be formed in a p-type well formed using the P doping stage of 14b. Thus, the resistors in a circuit in accordance with the invention may be formed as n-type resistance regions. Furthermore, instead of a doped resistance region 25' within the semiconductor body portion 100b, all of these PTC resistors may alternatively be formed in known manner as so-called thin-film resistors from a doped polycrystalline film deposited on top of the insulating layer on the semiconductor body portion 100b.

Although FIG. 4a illustrates a planar cellular geometry for the induced channel and the gate 18 along a major surface of the body 100, various known forms of so-called "trench-gate" geometry may be used for MOSFETs and IGBTs, in which the insulated gate 18 is present in a trench in the major surface of the semiconductor body 100, between neighbouring cells in the region 100b. In this case, the channel (induced in transistor-body region 14b) extends vertically along the side walls of the trench. It will be evident that the temperature sensor circuits of FIG. 1 (and alternative embodiments in accordance with the invention) may be integrated with a power semiconductor device MPWR of planar geometry as illustrated in FIG. 4(a) or, for example, of trench-gate geometry.

In the embodiment of FIG. 1, the circuit connection which couples together the hot-location temperature-sensitive elements of the Tabs and Tdiff circuits is at comparator inputs of both the Tabs and Tdiff circuits. Thus, in this preferred embodiment, the hot-location temperature-sensitive elements of the Tdiff circuit effectively include the hot-location temperature-sensitive elements Q1, R1, R2, and R3 of the Tabs circuit so as to derate the temperature gradient Tdiff threshold sensed at a comparator input of the Tdiff circuit as a function of the device temperature at a hot location. However, the circuit connection which couples together the hot-location temperature-sensitive elements of the Tabs and Tdiff circuits to provide the required derating may be made at the output of at least a Tabs-sensing circuit, instead of being at comparator inputs of both the Tabs and Tdiff circuits. This modified type of temperature sensor circuit of a power semiconductor component in accordance with the present invention comprises separate Tabs and Tdiff circuits (i.e. without the temperature-sensitive elements of the Tabs circuit being directly connected to the temperature-sensitive elements of the Tdiff circuit), and so is less advantageous in requiring more temperature-sensitive elements and more layout area than the FIG. 1 circuit.

In one form of this modified type of circuit, the output of the Tabs-sensing circuit may be fed to an input of the comparator CP2 of the separate Tdiff circuit to provide the required derating of the Tdiff threshold via the input of CP2. In different form of this modified type of circuit, the separate outputs of the Tabs-sensing circuit and the Tdiff comparator CP2 of the separate Tabs and Tdiff circuits may be fed (possibly via respective amplifier circuits to adjust their relative signal levels) to a summation circuit to provide the required derating of the Tdiff threshold at the output of the summation circuit.

Embodiments of the invention have been described for a High Side Switch HSS in which both the power semiconductor device MPWR and the temperature sensor circuit are powered from the voltage supply line 3. However, the same combined Tabs and Tdiff circuit principles in accordance with the invention may be used in a Low Side Switch (LSS), in which the power device MPWR is located on the ground side of its load.

Thus, in summary, the present invention provides particularly a power semiconductor device and/or temperature sensor circuit having any one or more of the novel features herein described and/or illustrated in the drawings.

From reading the present disclosure, other modifications and variations will be apparent to persons skilled in the art. Such modifications and variations may involve equivalent features and other features which are already known in the art and which may be used instead of or in addition to features already disclosed herein. Although claims have been formulated in this Application to particular combinations of features, it should be understood that the scope of the disclosure of the present application includes any and every novel feature or any novel combination of features disclosed herein either explicitly or implicitly and any generalisation thereof, whether or not it relates to the same invention as presently claimed in any Claim and whether or not it mitigates any or all of the same technical problems as does the present invention. The Applicants hereby give notice that new claims may be formulated to such features and/or combinations of such features during prosecution of the present application or of any further application derived therefrom.

What is claimed is:

1. A power semiconductor component comprising a power semiconductor device with a temperature sensor circuit, wherein the temperature sensor circuit comprises hot-location temperature-sensitive elements in a first comparator circuit and hot-location and cool-location temperature-sensitive elements in a second comparator circuit, the hot-location temperature-sensitive elements being located in the vicinity of a heat-generating active area of the power semiconductor device, and the cool-location temperature-sensitive element(s) being located more remote from the heat-generating active area, the hot-location temperature-sensitive elements of the first comparator circuit have different temperature coefficients for indicating device temperature in the vicinity of the heat-generating active area, the second comparator circuit with both the hot-location and cool-location temperature-sensitive elements serves for indicating when a temperature gradient threshold occurs between a hot location in the vicinity of the heat-generating active area and a cool location more remote from the heat-generating active area, and a circuit connection between the first and second comparator circuits which couples together the hot-location temperature-sensitive elements of the first and second comparator circuits and so makes the temperature gradient threshold indicated by the second comparator circuit into a decreasing function of the device temperature at a hot location.

2. A power semiconductor device as claimed in claim 1, wherein the hot-location temperature-sensitive elements of different temperature coefficients in the first comparator circuit have opposite, i.e. positive and negative, temperature coefficients.

3. A power semiconductor device as claimed in claim 1, wherein the temperature-sensitive elements of both the first and second comparator circuits are serially arranged in first and second parallel arms.

4. A power semiconductor device as claimed in claim 3, wherein the first and second arms form bridge arrangements for the first and second comparator circuits and are fed by current sources controlled by a PTAT (proportional-to-absolute-temperature) voltage.

5. A power semiconductor device as claimed in claim 3, wherein the first arm comprises a first hot-location temperature-sensitive element of the first comparator circuit biased via a first hot-location temperature-sensitive element of the second comparator circuit, and the second arm comprises a second hot-location temperature-sensitive element of the first comparator circuit biased via the cool-location temperature-sensitive element of the second comparator circuit.

6. A power semiconductor device as claimed in claim 5, wherein comparator inputs of the first comparator circuit are taken from a node of the said first hot-location temperature-sensitive elements of the first and second comparator circuits and from a node of the second hot-location temperature-sensitive element of the first comparator with the cool-location temperature-sensitive element of the second comparator circuit, and wherein comparator inputs of the second comparator circuit are taken from nodes of the first hot-location temperature-sensitive element and the cool-location temperature-sensitive element of the second comparator circuit with their respective PTAT current sources.

7. A power semiconductor device as claimed in claim 5, wherein the second hot-location temperature-sensitive element of the first comparator circuit is biased via a second hot-location temperature-sensitive element of the second comparator circuit in series with the cool-location temperature-sensitive element of the second comparator circuit, and wherein comparator inputs of the first comparator circuit are taken from a node of the said first hot-location temperature-sensitive elements of the first and second comparator circuits and from a node of the second hot-location temperature-sensitive element of the first comparator circuit with the second hot-location temperature-sensitive element of the second comparator circuit, and wherein comparator inputs of the second comparator circuit are taken from nodes of the first hot-location temperature-sensitive element and the cool-location temperature-sensitive element of the second comparator circuit with their respective PTAT current sources.

8. A power semiconductor device as claimed in claim 1, wherein a hysteresis feedback is provided in the comparator of the first comparator circuit, so as to inhibit hunting or cycling of the temperature sensor circuit.

9. A power semiconductor device as claimed in claim 8, wherein a hysteresis feedback is provided also in the comparator of the second comparator circuit, so as to inhibit hunting or cycling of the temperature sensor circuit.

\* \* \* \* \*